United States Patent
Murphy et al.

(10) Patent No.: US 10,333,472 B2
(45) Date of Patent: Jun. 25, 2019

(54) OPTICAL RECEIVER

(71) Applicant: FIRECOMMS LIMITED, Cork (IE)

(72) Inventors: Patrick Murphy, Cork (IE); Colm Donovan, Leap (IE); Ciaran Cahill, Blarney (IE)

(73) Assignee: FIRECOMMS LIMITED, Cork (IE)

( * ) Notice: Subject to any disclaimer, the term of this patent is extended or adjusted under 35 U.S.C. 154(b) by 0 days.

(21) Appl. No.: 15/758,414

(22) PCT Filed: Sep. 13, 2016

(86) PCT No.: PCT/EP2016/071526
§ 371 (c)(1),
(2) Date: Mar. 8, 2018

(87) PCT Pub. No.: WO2017/046067
PCT Pub. Date: Mar. 23, 2017

(65) Prior Publication Data
US 2018/0254756 A1 Sep. 6, 2018

(30) Foreign Application Priority Data
Sep. 15, 2015 (EP) .................... 15185216

(51) Int. Cl.
*H04B 10/06* (2006.01)
*H03F 3/08* (2006.01)
(Continued)

(52) U.S. Cl.
CPC .............. *H03F 3/087* (2013.01); *H03F 3/08* (2013.01); *H03F 3/45* (2013.01); *H03F 3/45071* (2013.01);
(Continued)

(58) Field of Classification Search
CPC ...... H04B 10/60; H04B 10/695; H04B 10/69; H04B 10/6933; H04B 10/6931;
(Continued)

(56) References Cited

U.S. PATENT DOCUMENTS

| 4,498,001 A | 2/1985 | Smoot |
| 5,430,766 A | 7/1995 | Ota et al. |

(Continued)

FOREIGN PATENT DOCUMENTS

| EP | 0 580 089 A1 | 1/1994 |
| EP | 0 809 370 A1 | 11/1997 |

OTHER PUBLICATIONS

International Search Report issued in PCT/EP2016/071526; dated Nov. 29, 2016.
(Continued)

*Primary Examiner* — Hibret A Woldekidan
(74) *Attorney, Agent, or Firm* — Studebaker & Brackett PC (57) ABSTRACT

A receiver has a differential transimpedance amplifier (4) with two inputs and two outputs. The differential transimpedance amplifier (4) provides a differential output and this is peak-detected (15, 16) to provide amplitude reference signals. The differential transimpedance amplifier output and the amplitude reference signals are fed to a differential summing amplifier (10), which provides a fully differential signal to a comparator, or to an automatic gain control circuit (5) to regulate the differential transimpedance amplifier gain. The differential summing amplifier (10) output is a fully differential signal, thereby having lower distortion for DC and burst mode receiver applications.

14 Claims, 5 Drawing Sheets

(51) Int. Cl.
*H03F 3/45* (2006.01)
*H03G 3/30* (2006.01)
*H04B 10/69* (2013.01)
*H03H 11/12* (2006.01)

(52) U.S. Cl.
CPC ......... *H03G 3/3052* (2013.01); *H04B 10/697* (2013.01); *H04B 10/6931* (2013.01); *H03F 2200/267* (2013.01); *H03F 2200/375* (2013.01); *H03F 2200/435* (2013.01); *H03F 2203/45151* (2013.01); *H03F 2203/45681* (2013.01); *H03H 11/12* (2013.01)

(58) Field of Classification Search
CPC .... H04B 10/697; H04B 10/616; H03H 11/12; H03F 3/087; H03F 3/08; H03F 3/45; H03F 3/45071; H03F 2200/267; H03F 2200/375; H03F 2200/435; H03F 2203/45151; H03F 2203/45681; H03F 3/45973; H03G 3/3052
USPC .................. 398/202, 208, 209, 210, 164
See application file for complete search history.

(56) References Cited

U.S. PATENT DOCUMENTS

| | | | | |
|---|---|---|---|---|
| 5,612,810 A * | 3/1997 | Inami | ................... | H04B 10/695 250/214 A |
| 5,777,507 A | 7/1998 | Kaminishi et al. | | |
| 5,793,230 A * | 8/1998 | Chu | ................... | H03K 5/007 327/307 |
| 6,084,478 A * | 7/2000 | Mayampurath | .... | H04B 10/6931 250/214 A |
| 6,151,150 A | 11/2000 | Kikuchi | | |
| 6,232,842 B1 | 5/2001 | Asano | | |
| 6,242,732 B1 * | 6/2001 | Rantakari | ............ | H03G 3/3084 250/214 A |
| 6,466,347 B1 * | 10/2002 | Nagahori | ............ | H04B 10/524 398/154 |
| 6,963,696 B1 * | 11/2005 | Bowler | .................. | H04B 10/66 398/202 |
| 8,463,143 B2 * | 6/2013 | Sugimoto | .......... | H04B 10/6933 250/200 |
| 8,483,581 B2 * | 7/2013 | Suzuki | ............. | H01L 31/02019 398/209 |
| 9,509,413 B2 * | 11/2016 | Suzuki | ...................... | H03F 3/08 |
| 10,128,398 B1 * | 11/2018 | Hayat | ................... | H01L 31/107 |
| 2002/0063937 A1 * | 5/2002 | Kikuchi | ................. | H03F 3/087 398/202 |
| 2011/0002188 A1 * | 1/2011 | Chen | ...................... | G11C 17/16 365/225.7 |
| 2015/0263812 A1 * | 9/2015 | Tatsumi | ............... | H04B 10/505 398/189 |

OTHER PUBLICATIONS

Nasir Abdul Quadir et al.; "An Inductorless Linear Optical Receiver for 20Gbaud/s (40Gb/s) PAM-4 Modulation Using 28nm CMOS"; 2014 IEEE International Symposium on Circuits and Systems (ISCAS); IEEE; Jun. 1, 2014; pp. 2473-2476.

Wei-Zen Chen et al.; "A 1.8-V 10-Gb/s Fully Integrated CMOS Optical Receiver Analog Front-End"; IEEE Journal of Solid-State Circuits; Jun. 1, 2005; pp. 1388-1396; vol. 40, No. 6; Piscataway, NJ, USA.

Roger Yubtzuan Chen et al.; "A CMOS Infrared Optical Preamplifier with a Variable-Gain Transimpedance Amplifier"; The 2004 IEEE Asia-Pacific Conference on Circuits and Systems; Dec. 6-9, 2004; pp. 265-268; vol. 1; IEEE; Piscataway, NJ, USA.

B. Shammugasamy et al.; "A 10-Gb/s Fully Balanced Differential Output Transimpedance Amplifier in 0.18-μm CMOS Technology for SDH/SONET Application"; IEEE Asia-Pacific Conference on Circuits and Systems (APCCAS); Nov. 30, 2008; pp. 684-687; IEEE; Piscataway, NJ, USA.

Ty Yoon et al.; "1.25 Gb/s CMOS Differential Transimpedance Amplifier for Gigabit Networks"; Proceedings of the 23rd European Solid-State Circuits Conference (ESSCIRC '97); 1997; pp. 140-143; Southampton, UK.

Yusuke Ota et al.; "High-Speed, Burst-Mode, Packet-Capable Optical Receiver and Instantaneous Clock Recovery for Optical Bus Operation"; Journal of Lightwave Technology; Feb. 1994, pp. 325-331; vol. 12, No. 2.

* cited by examiner

Single ended, pseudo and fully differential signals for a differential TIA

Fig. 3(a) Positive Peak Detector

Fig. 3(b) Negative Peak Detector

Fig. 4 Differential Summing Amplifier

Fig. 5 Pseudo differential to fully differential stage

Fig. 6 Flow diagram for Reset and DC Reference Level Control

Fig. 7

OPTICAL RECEIVER

INTRODUCTION

Field of the Invention

The invention relates to an optical receiver with a differential output, particularly for control and communication applications.

Prior Art Discussion

In many industrial and/or control applications the receiver in idle mode may be receiving a DC light level and then must respond without fail to the first bit of a command signal data stream sent at any arbitrary time over a wide received optical power range. The conversion of optical light into a voltage is usually implemented using a photodiode and a transimpedance amplifier (TIA). Where the dynamic range of the received light power is wide, a TIA with automatic gain control (AGC) is needed as to reduce the gain for higher received light power. The use of a fully differential TIA is preferred for noise and electromagnetic interference (EMI) immunity.

Figure 1:
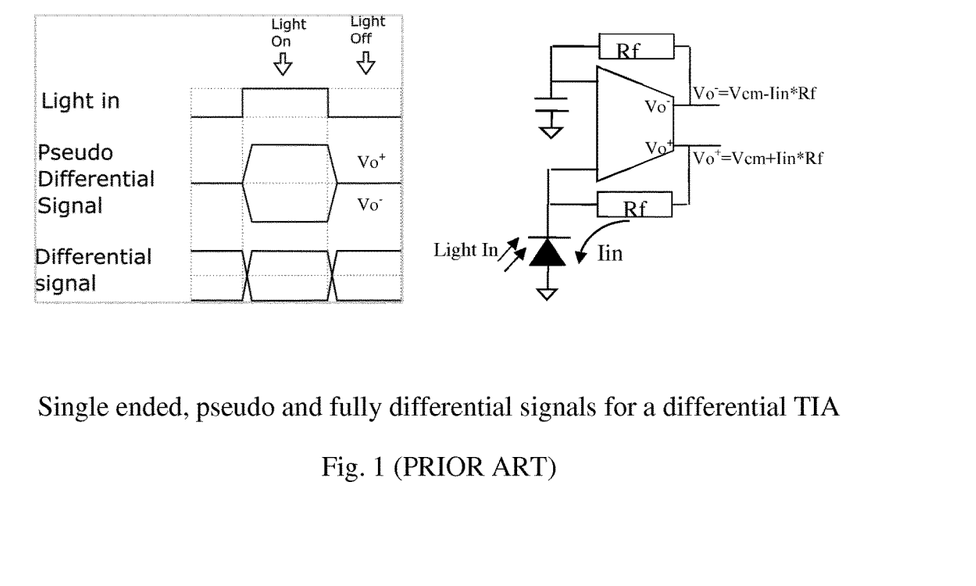
FIG. 1 is a set of representative plots showing light input signals and pseudo and fully differential outputs, as discussed above with reference to the prior art.

A photodiode has a single ended current output. A fully differential TIA outputs a pseudo differential signal, as illustrated by FIG. 1, when the input is a single photodiode. Creating an accurate comparator reference point for a pseudo differential signal at high speed instantaneously is difficult. Using a fully differential signal into a comparator ensures that the pulse width distortion (PWD) is low, which is needed for DC to multiple megahertz frequency applications. The circuit shown in FIG. 1 is a conventional differential TIA, with the output of such circuit being a pseudo differential signal.

An approach described in [1] below involves use of two low pass filters (LPFs) connected to an output buffer. However, the averaging operations of the LPFs tend to introduce delays.

An approach in [2] below involves a peak detector feeding back a correction signal to the input of a TIA. This method of feedback control to the input of the TIA is less desirable than a method of feed-forward control, because feedback inherently requires a signal delay.

EP0580089 (NEC) describes a receiver with a pre-amplifier for DC offset correction. U.S. Pat. No. 5,777,507 (Toshiba) describes a receiver for a digital signal of an arbitrary pattern. U.S. Pat. No. 4,498,001 describes a transimpedance amplifier for optical receivers.

The invention is directed towards providing an optical receiver with a fully differential output, without significant delay for receiving DC to multiple megahertz frequency optical light pulses over a large optical received power range, and preferably also with good immunity to both noise and electromagnetic interference (EMI).

REFERENCES

[1] Title: "1.25 Gb/s CMOS Differential Transimpedance Amplifier For Gigabit Networks"
Authors: Ty Yoon, Bahram Jalali.
Published: Proceedings of the 23rd European Solid-State Circuits Conference, 1997. ESSCIRC '97. Southampton, UK, Pages 140-143.
[2] Title: "High-speed, Burst-Mode, Packet-Capable Optical Receiver and Instantaneous Clock Recovery for Optical Bus Operation"
Authors: Yusuke Ota, Robert G. Swartz, Vance D. Archer 111, Steven K. Korotky, Mihai Banu, and Alfred E. Dunlop.
Published: JOURNAL OF LIGHTWAVE TECHNOLOGY, VOL. 12, NO. 2, FEBRUARY 1994, Pages 325-331.
Patent: U.S. Pat. No. 5,430,766 A, "Burst mode digital data receiver"
Filing date Aug. 22, 1994

SUMMARY OF THE INVENTION

According to the invention, there is provided an optical receiver comprising:
 a differential transimpedance amplifier TIA (4) having input cascodes, and being arranged to receive one or more photodiode inputs and to provide at least two outputs, positive and negative,
 a positive peak detector receiving the positive differential TIA output, a negative peak detector receiving the negative differential TIA output, and each providing a peak detection output as an amplitude reference signal,
 a differential summing amplifier arranged to receive the outputs of the differential TIA and the amplitude reference signals from the peak detectors, and
 wherein said differential summing amplifier directly or indirectly provides an output for the optical receiver.

In one embodiment, one photodiode is active and another photodiode is a dummy photodiode.

In one embodiment, the differential summing amplifier has linear gain.

In one embodiment, the differential summing amplifier is an active low pass filter.

In one embodiment, the peak detector output is fed into the differential summing amplifier with less gain than the differential TIA inputs into the differential summing amplifier.

In one embodiment, said gain is less by approximately half.

In one embodiment, the differential summing amplifier is connected at its output to a decision circuit, preferably a comparator.

In one embodiment, the cascodes are regulated gate cascodes.

In one embodiment, the receiver further comprises an automatic gain circuit for the differential transimpedance amplifier.

In one embodiment, the differential summing amplifier is connected at its output to the automatic gain circuit.

In one embodiment, the receiver further comprises an output comparator linked with the output of the differential summing amplifier, and wherein the output comparator has built-in hysteresis.

In one embodiment, the receiver further comprises a reset control circuit configured to reset the peak detectors.

In one embodiment, the output comparator has a DC offset level, with an offset level control input ($V_{OFFSET\_ENABLE}$), which is controlled by the control circuit and is adapted to ensure that the output is low for a minimum light level received.

In one embodiment, the reset control circuit is configured to assert offset level control ($V_{OFFSET\_ENABLE}$), and reset control ($V_{RESET}$) after a set timeout period when no light is received.

In another aspect, the invention provides an electronic or electro-optic device comprising a processing circuit linked to a receiver of any embodiment.

ADDITIONAL STATEMENTS

According to the invention, there is provided a receiver comprising:
 a first amplifier arranged to receive one or more transducer inputs,
 a peak detector arranged to receive an output of the first amplifier,
 a second amplifier arranged to receive the output of the first amplifier and an amplitude reference signal from the peak detector, and
 wherein said second amplifier directly or indirectly provides a receiver output.

In one embodiment, the first amplifier is a differential amplifier.

In one embodiment, said first amplifier is a differential transimpedance amplifier (TIA), the transducer providing a current signal.

In one embodiment, there are two transducer inputs to the first amplifier. In one embodiment, one transducer is active and another transducer is a dummy transducer.

In one embodiment, the transducer is a photo diode, the receiver, being an optical receiver, and there may also be a dummy or reference photodiode.

In one embodiment, the first amplifier provides at least two outputs, positive and negative, and there is a peak detector for one or both of said first amplifier outputs.

In one embodiment, the peak detector is arranged to feed a peak detection signal into the second amplifier simultaneously with an output of the differential TIA, so that the second amplifier provides differential outputs without delay.

In one embodiment, there is a peak detector receiving each of the positive and negative differential TIA outputs, and each providing a peak detection output to the amplifier.

In one embodiment, the second amplifier is a differential summing amplifier.

In one embodiment, the peak detector output is fed to the second amplifier with less gain than the differential TIA output.

In one embodiment, the gain is reduced by approximately half.

In one embodiment, the amplifier is connected at its output to a comparator or other decision circuit.

In one embodiment, the first amplifier has a cascode or a regulated gate cascode at it inputs.

In one embodiment, the receiver comprises an automatic gain circuit for the second amplifier.

In one embodiment, there is one peak detector and a common mode buffer amplifier providing signals to the second amplifier.

In one embodiment, there are positive and negative peak detectors.

In one embodiment, the receiver comprises at its output a comparator with a DC offset level, which driven by control circuitry ensures the output is low for no light received.

In one embodiment, the output comparator has built-in hysteresis.

In one embodiment, the receiver comprises an offset level control input ($V_{OFFSET\_ENABLE}$) which ensures that the comparator will output a low until the input from the second amplifier is above an offset level.

In one embodiment, a single transducer is used as a detector and the first amplifier is a single ended amplifier, and the second amplifier a differential summing amplifier.

In another aspect, the invention provides an electronic or electro-optic device comprising a processing circuit linked to a receiver as defined above in any embodiment.

DETAILED DESCRIPTION OF THE INVENTION

Brief Description of the Drawings

The invention will be more clearly understood from the following description of some embodiments thereof, given by way of example only with reference to the accompanying drawings in which:—

DESCRIPTION OF THE EMBODIMENTS

We describe various optical receivers which have lower distortion. In some embodiments this is achieved because the output crosses the zero line, thereby providing a fully differential output. The receiver has a differential transimpedance amplifier with two inputs and two outputs. The differential transimpedance amplifier, provides a differential output and this is peak-detected to provide amplitude reference signals. The differential transimpedance amplifier output and the amplitude reference signals are fed to a differential summing amplifier, which provides a fully differential output to a comparator, or an automatic gain control circuit to regulate the differential transimpedance amplifier gain.

Figure 2:
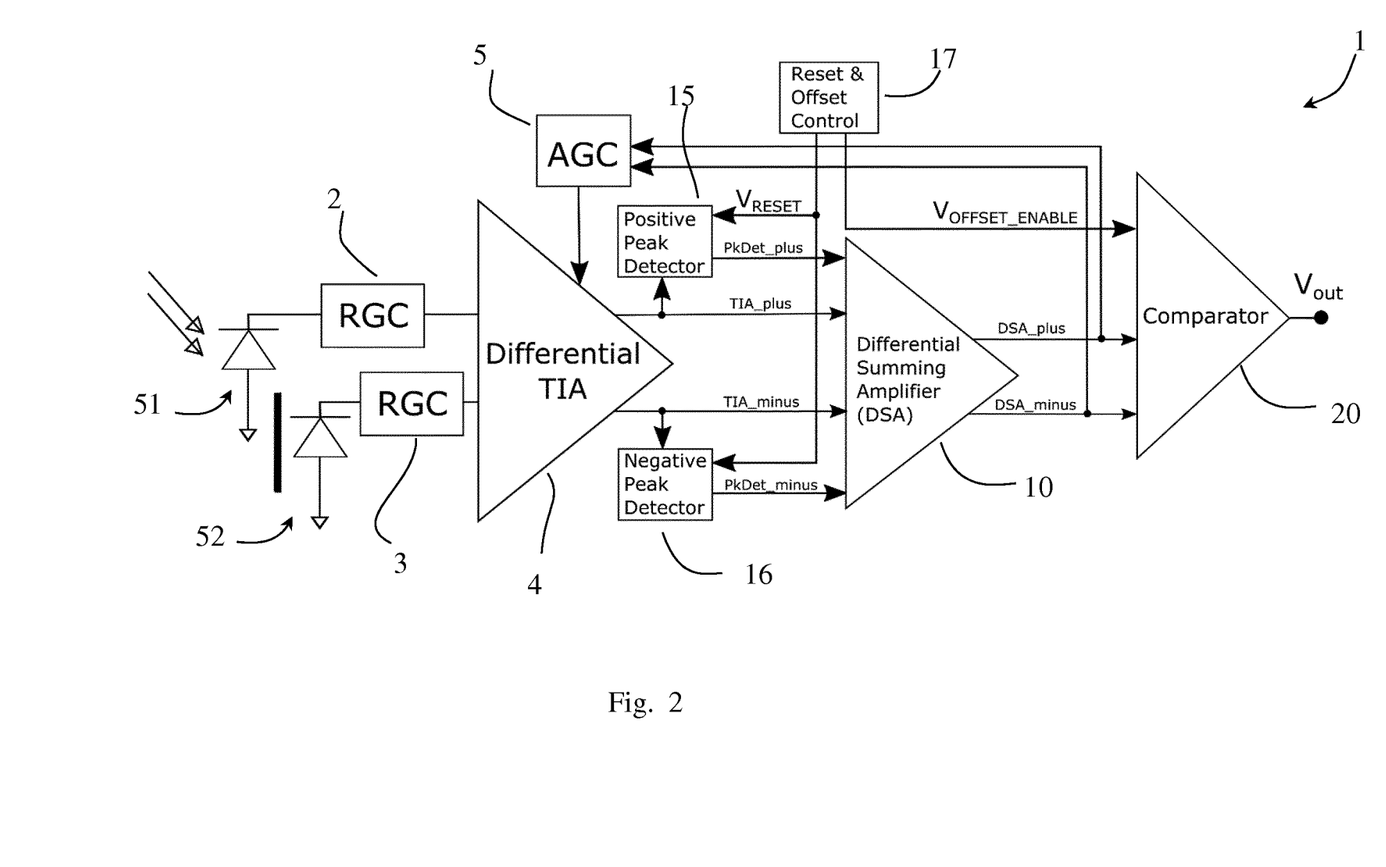
FIG. 2 is a block diagram of a receiver of the invention.

Referring to FIG. 2 an optical receiver 1 of the invention has regulated cascode (RGC) circuits 2 and 3 at the inputs to a first amplifier, in this case a differential TIA 4 with an AGC 5.

A differential summing amplifier (DSA) 10 receives the TIA 4 positive and negative outputs TIA_plus and TIA_minus. However, in addition there are two peak detectors 15 and 16. They receive the TIA_plus and TIA_minus signals respectively and provide the amplitude reference PkDet_plus and PkDet_minus outputs to the DSA 10. The defined bandwidth of the DSA is designed to the required application to filter out high frequency noise or disturbances. A reset and control circuit 17 is provided for resetting the detectors 15 and 16, and for providing an offset enable $V_{OFFSET\_ENABLE}$ signal to a comparator 20 providing the output signal $V_{out}$.

The DSA 10 provides DSA_plus and DSA_minus signals as inputs to the comparator 20, and to the AGC (automatic gain control circuit) 5. The AGC 5 input requires a linear representation of the received optical light power to assist in the loop design and stability, which is provided by the linear DSA 10 gain.

Figure 3A:
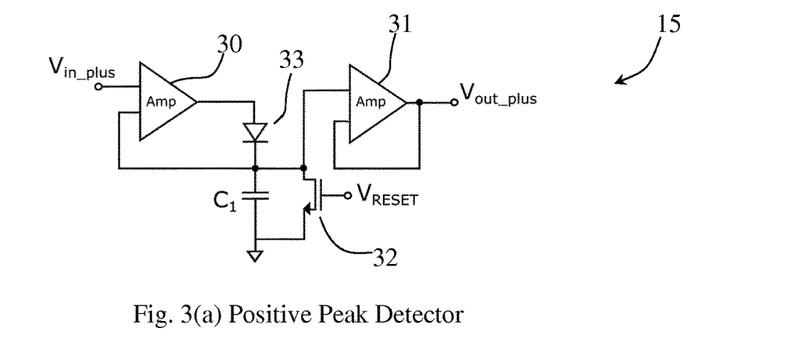
FIGS. 3(a) and 3(b) are circuit diagrams of positive peak detector and negative peak detector components of the receiver illustrated in FIG. 2.

As shown in FIG. 3(a) the peak detector 15 comprises a first amplifier 30 feeding a second amplifier 31 via a diode 33. There is a capacitor C1 to ground providing a peak detected amplitude reference input to the amplifier 30. The reset signal is connected to the gate of a switch 32 which links the signal input to the second amplifier 31 to ground. The output PkDet_plus is provided by the output of the second amplifier 31.

Figure 3B:
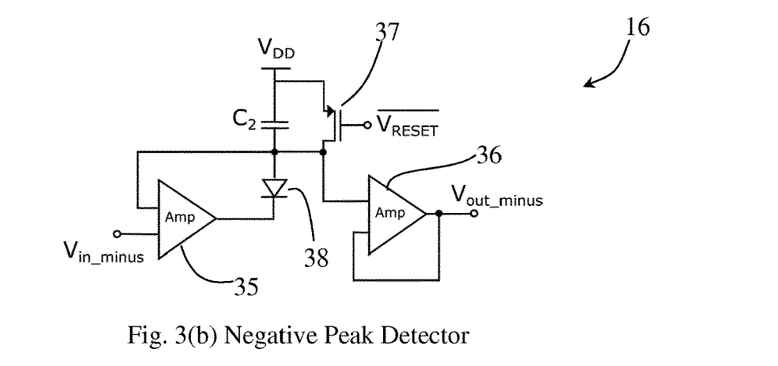

The negative peak detector 16 (FIG. 3(b)) has a similar architecture, with first and second amplifiers 35 and 36, a capacitor C2, a reset switch 37, and a diode 38. In most applications the amplifiers 30 and 35 can be identical, as can the amplifiers 31 and 36.

The DSA 10 (FIG. 4) comprises an amplifier 40 with feedback links via resistors $R_{FB}$ from the DSA_minus and DSA_plus outputs, which ensures that the DSA gain is linear, which is of benefit when using an AGC. The peak detector inputs are passed through resistances which are greater than those of the TIA inputs, in this case double. This reduces the gain of the differential peak detector by half compared to the differential TIA signals. The amplifier 40 contains common mode feedback with the common mode reference set from the common mode output of the TIA outputs.

In more detail, and referring again also to FIG. 2, the transducers are a signal receiving photodiode 51 and a dark photodiode 52, both of which are connected to the RGC 2 and 3, which feed into the differential TIA 4 whose gain may be adjusted with the AGC 5 control loop. The outputs of the differential TIA 4 feed into the DSA 10 and the two peak detectors 15 and 16 similarly connect into the DSA 10 with half the gain. The DSA stage 10 converts a pseudo differential input signal from the differential TIA 4 to a fully differential output signal which is connected to the comparator 20 and the AGC 5. The gain of the DSA is linear so that the AGC can automatically control the TIA gain, to ensure there is no saturation of the TIA. The comparator 20 may include a hysteresis function. The pseudo differential TIA output signals and the peak detected signals from the peak detector are fed into the DSA 10 almost simultaneously, and generate the fully differential output with minimum delay. The comparator may also include an offset level control input $V_{OFFSET\_ENABLE}$ which ensures the comparator will output a low until the input from the DSA is above an offset level. This can be used to ensure that the comparator outputs a low in static off mode, which is needed for receiving DC or low megahertz data. When light is being received $V_{OFFSET\_ENABLE}$ is disabled so that comparator has a zero crossover offset to achieve high quality PWD performance.

Figure 4:
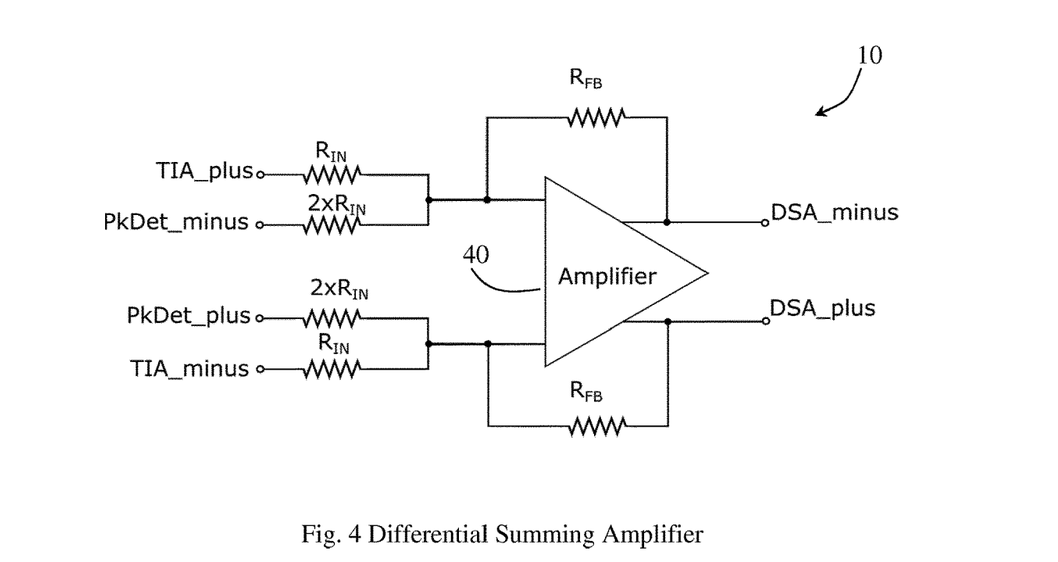
FIG. 4 is a circuit diagram of a differential summing amplifier of the receiver illustrated in FIG. 2.

FIG. 4 shows the DSA circuit with the output equal to:

$$DSA_{diff} = Gain_{DSA} * \left[ TIA_{diff} - \left( \frac{PkDet_{diff}}{2} \right) \right]$$

where $$DSA_{diff} = DSA\_plus - DSA\_minus$$

$$TIA_{diff} = TIA_{plus} - TIA\_minus$$

$$PkDet_{diff} = PkDet\_plus - PkDet\_minus$$

are the differential outputs of the DSA, TIA and peak detector circuit, with the linear gain of the DSA circuit:

$$Gain_{DSA} = \frac{R_{FB}}{R_{IN}}.$$

The $$\frac{PkDet_{diff}}{2}$$

is achieved by having $2 \times R_{IN}$ at the peak detector inputs to the DSA circuit. Assuming $R_{IN} = R_{FB}$, $Gain_{DSA} = 1$ the output of the DSA is equal to:

$$DSA_{diff} = \left[ TIA_{diff} - \left( \frac{PkDet_{diff}}{2} \right) \right]$$

Table 1 below describes the output states of the TIA, Peak Detector, DSA, DC Ref Level input, and comparator output, for static off, light on and off modes, assuming $Gain_{DSA}=1$.

TABLE 1

Outputs for static off, light on and off modes

| | Static off mode | Light On | Light Off | Comment |
|---|---|---|---|---|
| Differential TIA output | 0 | $TIA_{diff}$ | 0 | |
| Peak Detector Output | 0 | $TIA_{diff\_max}$ | | where $PkDet_{diff} = TIA_{diff\_max}$ after 1st pulse of light |
| Differential Summing Amplifier (DSA) output | 0 | $+\left(\frac{TIA_{diff}}{2}\right)$ | $-\left(\frac{TIA_{diff}}{2}\right)$ | where $DSA_{diff} = \left[ TIA_{diff} - \left( \frac{PkDet_{diff}}{2} \right) \right]$ |
| Offset Level Control $V_{OFFSET\_ENABLE}$ | Enabled | Disabled | | Enabled only when waiting for $1^{st}$ pulse |
| Comparator Output | Low | High | Low | |

Figure 5:
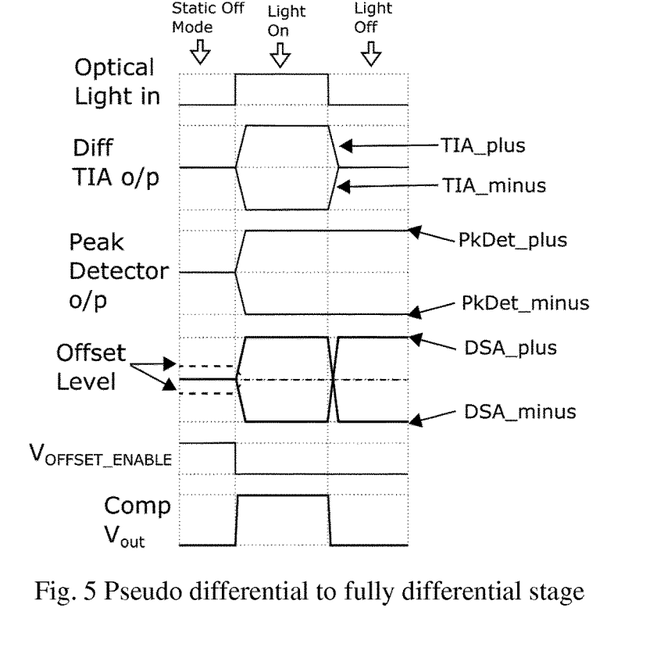
FIG. 5 is a series of plots showing stages of how the receiver provides a fully differential signal.

FIG. 5 illustrates the relevant signals from the block diagram in FIG. 2. The signals show the pseudo differential TIA output signals (TIA_plus, TIA_minus). The PkDet_plus signal is the maximum of the TIA_plus signal, and the PkDet_minus is the minimum of the TIA_minus signal. The TIA output signals, and the positive and negative peak detectors signals are all combined to create the fully differential DSA output signals (DSA_plus, DSA_minus). The DSA outputs (DSA_plus, DSA_minus) are used by the comparator to generate the digital comparator output (Comp Vout). The comparator has hysteresis controlled by $V_{OFFSET\_ENABLE}$.

Figure 6:
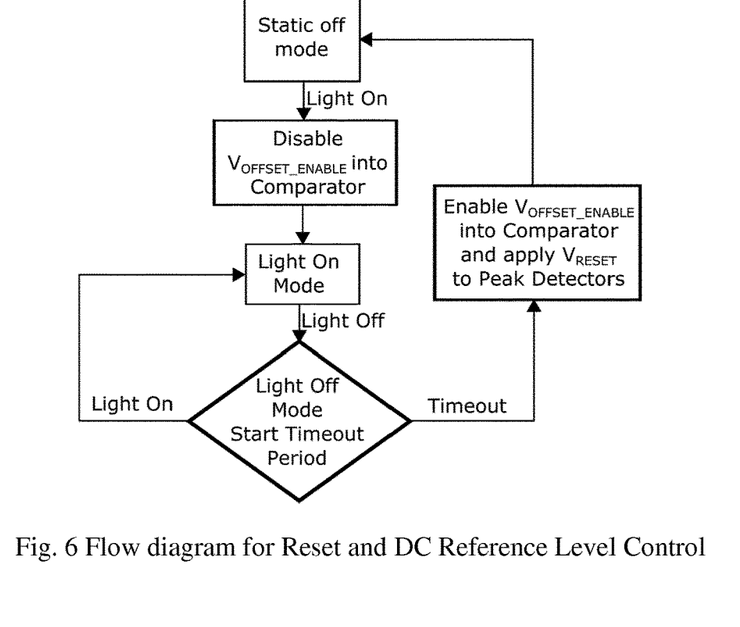
FIG. 6 is a logic diagram for operation of the receiver for reset and DC offset level control.

The flow diagram of FIG. 6 describes the operation of the reset ($V_{RESET}$) and offset level control ($V_{OFFSET\_ENABLE}$) signals. Once in static off mode, if light is received then the $V_{OFFSET\_ENABLE}$ is disabled into the comparator. If no light is received for a timeout period then the $V_{OFFSET\_ENABLE}$ is enabled and the peak detectors are reset so the receiver returns to static off mode. This control of the $V_{OFFSET\_ENABLE}$ signal allows the receiver to receive DC to megahertz data.

Figure 7:
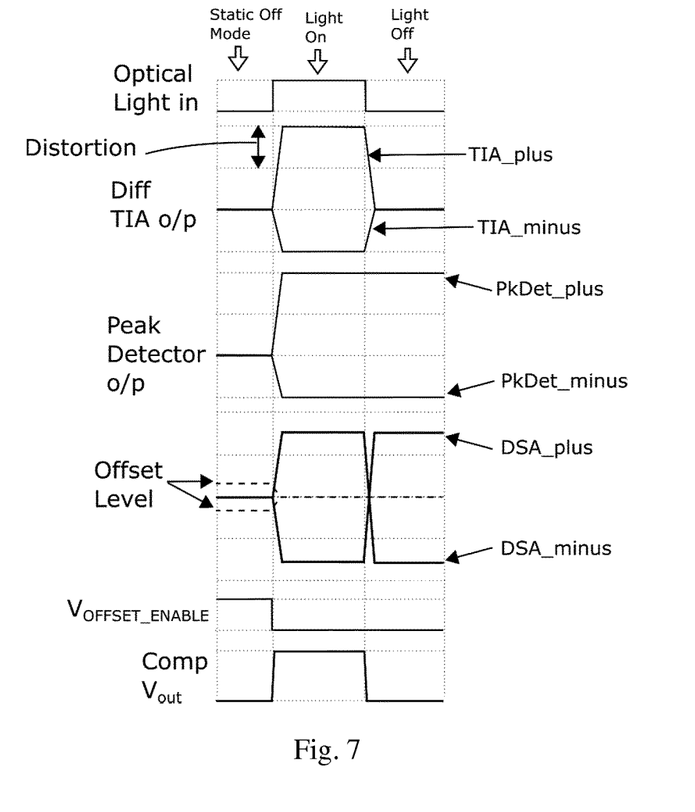
FIG. 7 is a series of plots showing stages of how the receiver provides a fully differential signal, from a distorted TIA output.

A major benefit of two peak detectors is that they balance the capacitive loading on the differential TIA, which improves the accuracy of the receiver architecture in EMI and noise rejection, and the accuracy for receiving low input power. When light is received the outputs of the TIA can be unbalanced. This means that the difference between the common mode of the TIA, and its outputs TIA_plus and TIA_minus signals may not be equal. This is illustrated by the deliberately distorted TIA outputs in FIG. 7. Combining the two peak detectors and the DSA helps to remove the majority of these unbalanced TIA outputs. With suitable DSA gain, the DSA output is a fully differential output with equal amplitudes for both light on and off cases, even though the TIA outputs are unbalanced. The removal of this distortion results in a low PWD output.

The architecture in FIG. 2 has multiple advantageous roles:
(a) Creation of a fully differential signal from the pseudo differential TIA outputs.
(b) Provides equal loading on the TIA outputs, which keeps the architecture symmetric.
(c) Reduces most of the possible imbalance in the TIA outputs for received light.
(d) The DSA amplifies the signal from the TIA outputs for low received light power.
(e) The DSA filters the signals to the required bandwidth so that no high frequency noise is fed through to the comparator 20.
(f) The DSA provides a linear representation of the light received to the AGC, with the linear DSA gain.
(g) Insofar as possible a symmetric differential architecture is created from the TIA outputs to the comparator inputs.

It will be appreciated that the invention achieves a fully differential output without significant delay because of its ability to produce a fully differential signal on the first pulse, which is important in detecting a signal from a single high speed input pulse. The advantages of implementing with two peak detectors and a DSA, with reduced propagation delay ensures that the DSA output will respond with negligible delay to the differential TIA outputs, and with the benefit of a high tolerance to any TIA imbalances. The linear gain of the DSA allows the outputs to be used by an AGC, as it a linear representation of the light received.

Also, there is reduced noise induced by EMI and other sources because the differential TIA architecture, the balanced load architecture of two peak detectors and the differential summing amplifier will reject any common interference. The differential summing amplifier can be used to amplify low amplitude TIA signals, and to filter the signals to the required bandwidth, which improves the signal to noise ratio of the inputs to the comparator.

The invention is not limited to the embodiments described but may be varied in construction and detail. In one example the photodiodes are monolithic integrated photodiodes. This is advantageous because there is no wire-bond induced disturbances or noise for the receiver to reject, which would be the case for an external pin photodiode. The receiver may have transducers other than photodiodes and may in some cases be optical receivers.

The invention claimed is:

1. An optical receiver comprising:
a differential transimpedance amplifier TIA having input cascodes, and being arranged to receive one or more photodiode inputs and to provide at least two outputs, positive and negative,
a positive peak detector receiving the positive differential TIA output, a negative peak detector receiving the negative differential TIA output, and each providing a peak detection output as an amplitude reference signal,
a differential summing amplifier arranged to receive the outputs of the differential TIA and the amplitude reference signals from the peak detectors,
wherein said differential summing amplifier directly or indirectly provides an output for the optical receiver,
wherein the receiver further comprises an automatic gain circuit for the differential transimpedance amplifier, and wherein the differential summing amplifier is connected at its output to the automatic gain circuit, and
wherein the peak detector output is fed into the differential summing amplifier with less gain than gain of the differential TIA inputs into the differential summing amplifier.

2. The optical receiver as claimed in claim 1, wherein one photodiode is active and another photodiode is a dummy photodiode.

3. The optical receiver as claimed in claim 1, wherein the differential summing amplifier has linear gain.

4. The optical receiver as claimed in claim 1, wherein the differential summing amplifier is an active low pass filter.

5. The optical receiver as claimed in claim 1, wherein said gain of the peak detector output is less by approximately half.

6. The optical receiver as claimed in claim 1, wherein the differential summing amplifier is connected at its output to a decision circuit, preferably a comparator.

7. The optical receiver as claimed in claim 1, wherein the cascodes are regulated gate cascodes.

8. The optical receiver as claimed in claim 1, further comprising an output comparator linked with the output of the differential summing amplifier, and wherein the output comparator has built-in hysteresis.

9. The optical receiver as claimed in claim 8, wherein the output comparator has a DC offset level, with an offset level control input ($V_{OFFSET\_ENABLE}$), which is controlled by the control circuit and is adapted to ensure that the output is low for a minimum light level received.

10. The optical receiver as claimed in claim 1 further comprising a reset control circuit configured to reset the peak detectors.

11. The optical receiver as claimed in claim 10, wherein the reset control circuit is configured to assert offset level control ($V_{OFFSET\_ENABLE}$), and reset control ($V_{RESET}$) after a set timeout period when no light is received.

12. An electronic or electro-optic device comprising a processing circuit linked to a receiver of claim 1.

13. An optical receiver comprising:
a differential transimpedance amplifier TIA having input cascodes, and being arranged to receive one or more photodiode inputs and to provide at least two outputs, positive and negative,
a positive peak detector receiving the positive differential TIA output, a negative peak detector receiving the negative differential TIA output, and each providing a peak detection output as an amplitude reference signal,
a differential summing amplifier arranged to receive the outputs of the differential TIA and the amplitude reference signals from the peak detectors,
wherein said differential summing amplifier directly or indirectly provides an output for the optical receiver,
wherein the receiver further comprises an automatic gain circuit for the differential transimpedance amplifier, and wherein the differential summing amplifier is connected at its output to the automatic gain circuit,
wherein the optical receiver further comprises an output comparator linked with the output of the differential summing amplifier, and wherein the output comparator has built-in hysteresis, and
wherein the output comparator has a DC offset level, with an offset level control input ($V_{OFFSET\_ENABLE}$), which is controlled by the control circuit and is adapted to ensure that the output is low for a minimum light level received.

14. An optical receiver as claimed in claim 13, further comprising a reset control circuit configured to reset the peak detectors,
wherein the reset control circuit is configured to assert offset level control ($V_{OFFSET\_ENABLE}$), and reset control ($V_{RESET}$) after a set timeout period when no light is received.

* * * * *